United States Patent
Lokere (10) Patent No.: US 7,365,600 B1
(45) Date of Patent: Apr. 29, 2008

(54) NON-FEEDBACK IMPLEMENTED CONTROL OF THE OUTPUT-COMMON MODE OF A DIFFERENTIAL AMPLIFIER

(75) Inventor: Kristiaan Bernard Peter Lokere, Westford, MA (US)

(73) Assignee: Linear Technology Corporation, Milpitas, CA (US)

( * ) Notice: Subject to any disclaimer, the term of this patent is extended or adjusted under 35 U.S.C. 154(b) by 131 days.

(21) Appl. No.: 11/142,477

(22) Filed: Jun. 2, 2005

(51) Int. Cl.
*H03F 3/45* (2006.01)
(52) U.S. Cl. ...................... 330/258; 330/260
(58) Field of Classification Search ............ None
See application file for complete search history.

(56) References Cited

U.S. PATENT DOCUMENTS 5,148,119 A  9/1992  Wright et al.
6,642,788 B1 * 11/2003 Abughazaleh ............ 330/258
7,088,181 B1 *  8/2006 Voo ............................ 330/258
2006/0244532 A1 * 11/2006 Trifonov et al. ........... 330/258

* cited by examiner

*Primary Examiner*—Khanh Van Nguyen
(74) *Attorney, Agent, or Firm*—McDermott Will & Emery LLP (57) ABSTRACT

A differential amplification circuit includes a differential amplifier and common mode control circuitry configured to control output common mode of the differential amplifier. However, this control circuitry does not use feedback. The circuitry controls the output common mode in either, or in a combination of two ways, neither of which employs feedback from the output common mode. One control technique uses a dummy circuit and comparator to cancel out the effect of variations in process, temperature and supply voltage on output common mode. Another control technique measures input common mode voltage, compares the measured common mode to a reference, and based on the difference, applies a current to the output that compensates for the variation in output common mode that a given input common mode would otherwise cause.

20 Claims, 5 Drawing Sheets

NON-FEEDBACK IMPLEMENTED CONTROL OF THE OUTPUT-COMMON MODE OF A DIFFERENTIAL AMPLIFIER

TECHNICAL FIELD

The present subject matter relates to controlling the output common mode of differential amplifiers, and more particularly, doing so without implementing output common mode feedback

BACKGROUND

A differential amplifier is a well-known type of amplifier circuit, which provides an output signal that is proportional to the difference between two input signals. An ideal differential amplifier is designed to amplify the difference between the two input signals. Differential amplifiers of the type discussed herein have both differential inputs and differential outputs. Typically, such amplifiers exhibit a fixed closed-loop gain established by feedback-resistors and gain-resistors. The common mode gain of this type of amplifier is low.

Figure 7:
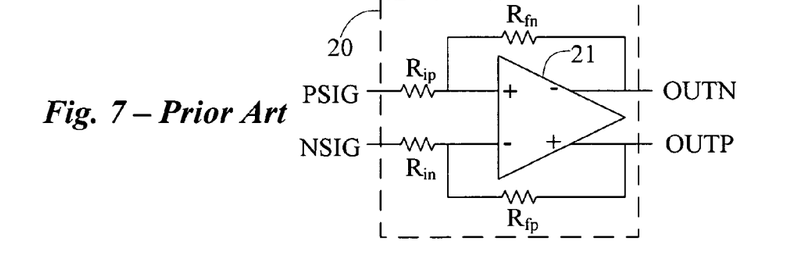
FIG. 7 is a functional block diagram of a common differential amplifier of the type described.

FIG. 7 shows a differential amplifier circuit 20 comprising an amplifier 21 having positive (+) and negative (−) inputs. The amplifier 21 amplifies the difference between the signals applied to its positive (+) and negative (−) inputs and provides amplified positive (+) and negative (−) outputs, on lines OUTN and OUTP. The amplifier 21 exhibits an output impedance between the output terminals.

Circuit 20 includes feedback-resistors ($R_{fn}$, $R_{fp}$) and gain-resistors ($R_{ip}$, $R_{in}$) connected to the inputs of amplifier 21. Positive input PSIG is connected through gain-resistor $R_{ip}$ to the positive input terminal of amplifier 21. Negative input NSIG is connected through gain-resistor $R_{in}$ to the negative input terminal of amplifier 21. Feedback from the negative output OUTN is applied, through feedback resistor $R_{fn}$, to the positive input terminal of amplifier 21. Feedback from the positive output OUTP is applied, through feedback resistor $R_{fp}$, to the negative input terminal of amplifier 21. The values of the gain resistors ($R_i$) and the feedback resistors ($R_f$) establish the closed-loop gain of the amplifier circuit 20.

"Common mode" in general is the average value of two or more signals. The amplifier circuit 21 of FIG. 7 will produce the difference between the two outputs OUTP and OUTN. However, without further processing, the circuit will not produce the average or common mode between those two outputs. For example, assume there is a 1 volt difference between inputs PSIG and NSIG, and the resistors establish a gain of unity. There will be a 1 volt difference in voltage between the two outputs OUTP and OUTN. However, each output voltage OUTP and OUTN can be at any voltage level (so long as the two outputs are 1 volt apart), because the average or common mode is not established.

The common mode level of the output of a differential amplifier of the type described may be established using feedback. The average value of the two outputs is measured and compared to a desired value. Common mode can be measured at the node interconnecting two equal value resistors (impedances) of a voltage divider. A current or voltage proportional to the difference between the measured common mode and the desired value is generated. This current or voltage is then applied to bias the differential amplifier so as to influence the output common mode. A negative feedback loop acts to cause the output common mode to track closely to the desired value.

Figure 8:
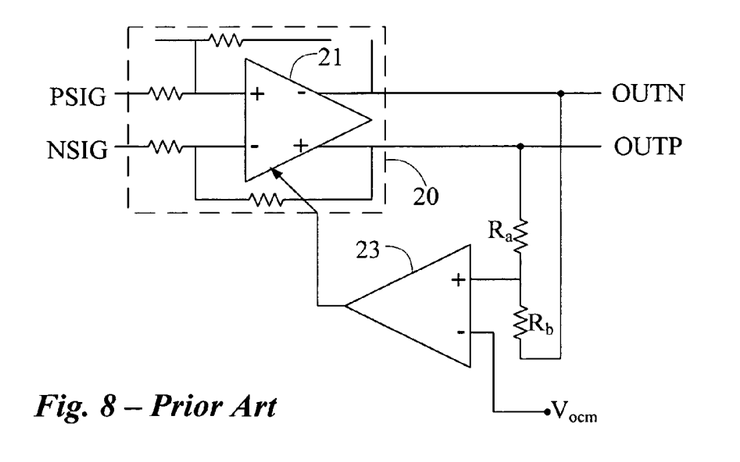
FIG. 8 is a functional block diagram of a prior art technique of providing common mode feedback for the differential amplifier of FIG. 7.

FIG. 8 illustrates a prior art implementation for setting the common mode level of the output of a differential amplifier using feedback. In this example, the main amplifier circuit 20 is of a type shown in FIG. 7 and described above. A pair of equal value resistors $R_a$ and $R_b$ are connected across the differential output lines OUTN and OUTP. The voltage at the node between resistors $R_a$ and $R_b$ represents the average value of the two outputs. An operational amplifier 23 compares average value at its input (+) to a desired common mode value $V_{ocm}$ at its input (−). The amplifier 23 produces a signal proportional to the difference between the measured average and the desired common mode value $V_{ocm}$, which is applied to bias the differential amplifier 21, so as to influence the output common mode. The negative feedback loop through amplifier 23 acts to drive the output common mode to the desired value $V_{ocm}$.

A disadvantage of the described circuit (FIG. 8) is that the common-mode feedback loop can be difficult to compensate or stabilize. The signal path from the control input of the main amplifier (where the amplifier receives the control/feedback signal) to each amplifier output can be a high frequency signal path and is a part of the common mode feedback loop. Such a path may have several poles/phase shifts, and tends to oscillate. Stabilizing such a circuit may be difficult. Also, there can be interactions between the common-mode feedback loop and the main (differential) feedback loop, which can further complicate the design.

SUMMARY

A differential amplifier in accord with the disclosure is configured with non-feedback implemented common mode control circuitry to control the output common mode of the differential amplifier.

In one example of the control, a dummy circuit simulates common mode operation of the differential amplifier. A comparator provides a correction signal, based on a comparison of a simulated output common mode signal from the dummy circuit to a common mode reference value. The differential amplifier is controlled in response to the correction signal.

In one exemplary implementation, an amplification circuit for providing differential amplification comprises a differential amplifier for amplifying a difference between signals appearing on its inputs and supplying signals having an amplified difference to its outputs, and a dummy circuit. The dummy circuit has an operational characteristic corresponding to an operational characteristic of the differential amplifier. The amplification circuit includes a circuit for comparing a signal produced by the dummy circuit to a common mode reference value. The comparator provides a correction signal corresponding to feedback for adjusting operation of the dummy circuit to correspond to the common mode reference value. The correction signal is coupled to the differential amplifier so as to adjust the output common mode of the differential amplifier.

In another example, the control circuitry comprises an averaging circuit and a differential transconductance amplifier. The averaging circuit measures an average of signals input to the differential amplification circuit. The amplifier produces a current proportional to a difference between the measured average of the input signals and a common mode reference value. The resulting current is supplied as a correction to an output of the differential amplifier, e.g. to offset a current that would otherwise flow forward through a feedback resistor coupled to the differential amplifier when the input common mode differed from the output common mode.

In another embodiment of the disclosure, a circuit for providing differential amplification includes a differential amplifier and one or more resistors connected to provide feedback. An averaging circuit measures the average of the input signals. In this example, a common mode control circuit is responsive to the measured average of the input signals for supplying a current to an output of the differential amplifier. This current provides an offset in terms of common mode operation, for any current that may flow between an input and an output of the differential amplifier through at least one of the resistors, e.g. where the input common mode is different from the output common mode.

The common mode control circuitry may utilize both the simulation based common mode control and the injection of current at the output to compensate for differences between the input common mode and the output common mode. In an example of that arrangement, the circuit for providing differential amplification includes the amplifiers and feedback resistors, as well as a dummy circuit and a comparator. The dummy circuit has an operational characteristic corresponding to an operational characteristic of the differential amplifier. The comparator compares a signal produced by the dummy circuit to a common mode reference value. This comparison produces a correction signal corresponding to feedback for adjusting operation of the dummy circuit to correspond to the common mode reference value. The correction signal is coupled to the differential amplifier, so as to adjust output common mode of the differential amplifier. This exemplary amplification circuit also includes an averaging circuit for measuring the average of the input signals and a common mode control circuit. The common mode control circuit is responsive to the measured average of the input signals, and configured to supply a current to an output of the differential amplifier to offset any current that may flow from or to an input of the differential amplifier through at least one of the resistors.

Additional objects, advantages and novel features will be set forth in part in the description which follows, and in part will become apparent to those skilled in the art upon examination of the following and the accompanying drawings or may be learned by production or operation of the examples. The objects and advantages of the present teachings may be realized and attained by practice or use of the methodologies, instrumentalities and combinations particularly pointed out in the appended claims.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and circuitry have been described at a relatively high-level, without detail, in order to avoid unnecessarily obscuring aspects of the present teachings.

As disclosed herein, a differential amplification circuit includes a differential amplifier and common mode control circuitry. The common mode control circuitry is configured to control output common mode of the differential amplifier. However, this control circuitry does not use common mode feedback from the output(s) of the differential amplifier.

The techniques disclosed herein, control the output common mode in either, or in a combination, of two ways, neither of which employs feedback from the output common mode. In a first approach, a bias circuit that may be modeled on the amplifier cancels out the effect of variations in process, temperature and supply voltage on output common mode. The result is a fixed dependency between input common mode and output common mode, due to the common mode current that flows through the feedback resistors into the output impedance if the input common mode is different from the desired output common mode. Another way to control output common mode is with a circuit that measures input common mode voltage and uses that information to apply a current to the output so as to compensate for the variation in output common mode that a given input common mode would otherwise cause.

Reference now is made in detail to the examples illustrated in the accompanying drawings and discussed below.

Figure 1:
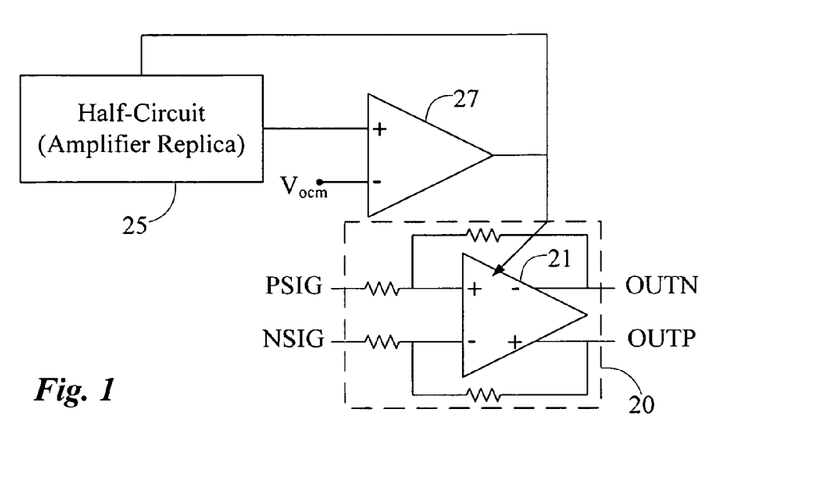
FIG. 1 is a functional block diagram of a differential amplifier with circuitry to simulate the amplifier and feedback, and provide the simulated common mode feedback as a correction signal to the differential amplifier.

FIG. 1 illustrates a circuit arrangement that cancels out the effect of variations in process, temperature and supply voltage on output common mode. This technique utilizes a dummy circuit, in the form of a half-circuit 25 replicating the amplifier 21, in the example. A dummy circuit is a circuit constructed on the same semiconductor chip or die as the main circuit designed to replicate or simulate some operation of the main circuit. Because it is on the same die, the dummy circuit is subject to the same secondary effects as the main circuit, e.g. process variations, temperature and supply voltage. Hence, the dummy circuit can be used to measure the secondary effects and enable correction for those effects in the main circuit.

In the present context, the half-circuit 25 used as the dummy circuit simulates the output common mode of the differential amplifier 21. A comparator 27 compares the output of the dummy circuit 25 to a desired or reference value $V_{ocm}$ for the output common mode of the differential amplifier 21. The difference measured by the comparator 27 is used as a feedback signal to correct operation of the dummy circuit 25 for the secondary effects that influence the output common mode of the differential amplifier 21. This same signal (or a signal of the same magnitude) from the comparator 27 is applied to bias the differential amplifier 21, so as to provide a similar correction.

Figure 2:
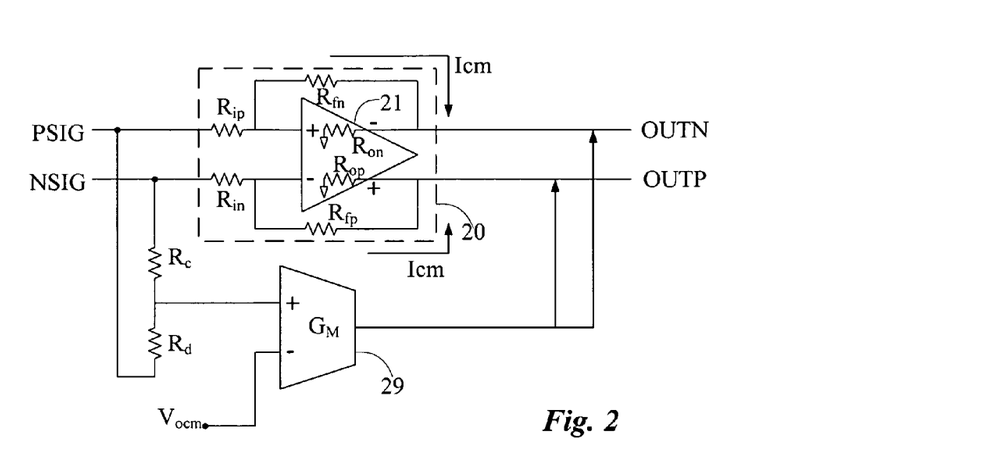
FIG. 2 is a functional block diagram of a differential amplifier with a circuit that measures the input common mode voltage and uses that information to apply a current to the output so as to compensate for any common mode current that would otherwise flow through the feedback resistors into the output impedance of the main amplifier when the input common mode differs from the output common mode.

Another correction technique disclosed herein involves correcting common mode operation for the current that flows through the feedback resistors if the input common mode varies with respect to the desired output common mode. FIG. 2 illustrates a circuit arrangement that measures the input common mode voltage and uses that information to apply a current to the output that correctly compensates for the variation in output common mode that a given input common mode would otherwise cause.

For a typical differential amplifier circuit 20, if the input common mode applied to inputs PSIG and NSIG is different from the desired output common mode at OUTP and OUTN, some current (Icm) will flow forward through the gain resistors $R_{ip}$ and $R_{in}$ and the feedback resistors $R_{fn}$, $R_{fp}$ and into the outputs OUTN, OUTP of the amplifier 21. If left uncorrected, this current flow combines with the output impedances $R_{op}$ and $R_{on}$ at OUTP and OUTN and produces an error in the output common mode.

The approach illustrated in FIG. 2 utilizes a circuit to measure the average of the input signals (input common mode) and implements a transconductance device 29 to produce one or more currents to compensate the output common mode for the current flow through the resistors. The device 29 is a differential transconductance type amplifier, producing one or more output currents proportional to a difference between two input voltage, that is, between the input common mode (average) and a reference value.

As shown in FIG. 2, a pair of equal value resistors $R_c$ and $R_d$ are connected across the differential input lines PSIG and NSIG. The voltage appearing on the node of connection between the resistors $R_c$ and $R_d$ represents the average value of the two input signals. Transconductance ($G_M$) amplifier 29 compares the average signal (received on its positive+ input) to the desired output common mode value $V_{ocm}$ (received on its negative-input) and feeds the resulting current forward into the output nodes OUTP and OUTN. Current applied to OUTP and OUTN cancels out the current (Icm) that flows forward through the gain resistors $R_{in}$ and $R_{ip}$ and the feedback resistors $R_{fn}$, $R_{fp}$ due to variation in input common mode. At each output, the offset current from the transconductance amplifier 29 sums with the Icm current in such a manner that there is no current left to flow through the respective common mode output impedance $R_{on}$ or $R_{op}$. As a result, the net current flowing into the output impedances $R_{on}$ and $R_{op}$ is zero, so that no common mode errors are created.

Figure 3:
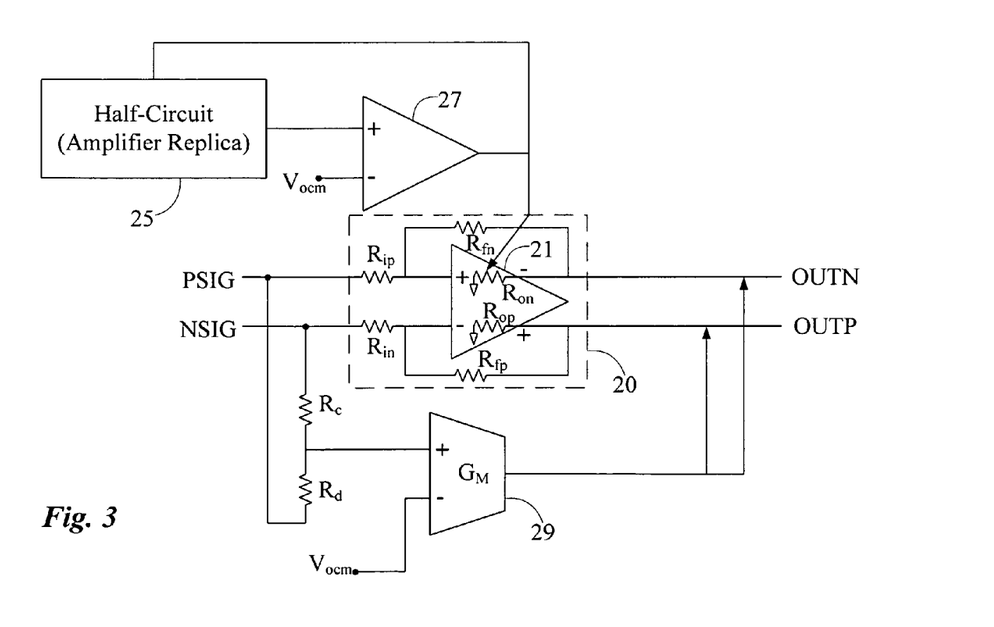
FIG. 3 is a functional block diagram of a differential amplifier with circuitry for providing both types of common mode correction.

FIG. 3 illustrates a combination of the two techniques discussed above. Half-circuit 25 and comparator 27 provide a control signal to differential amplifier 21, to cancel out the effect of variations in process, temperature and supply voltage on output common mode. As a result, there is now a fixed dependency between input common mode at PSIG, NSIG and output common mode at OUTP, OUTN, due to the common mode current that flows through the feedback resistors into the output impedance if the input common mode is different from the desired output common mode. The resistors $R_c$ and $R_d$ measure the input common mode voltage, and the transconductance amplifier 29 uses that information to apply a current to the outputs to compensate for the variation in output common mode that a given input common mode would otherwise cause.

It may be helpful now to consider some specific examples of the described circuits in somewhat more detail.

Figure 4:
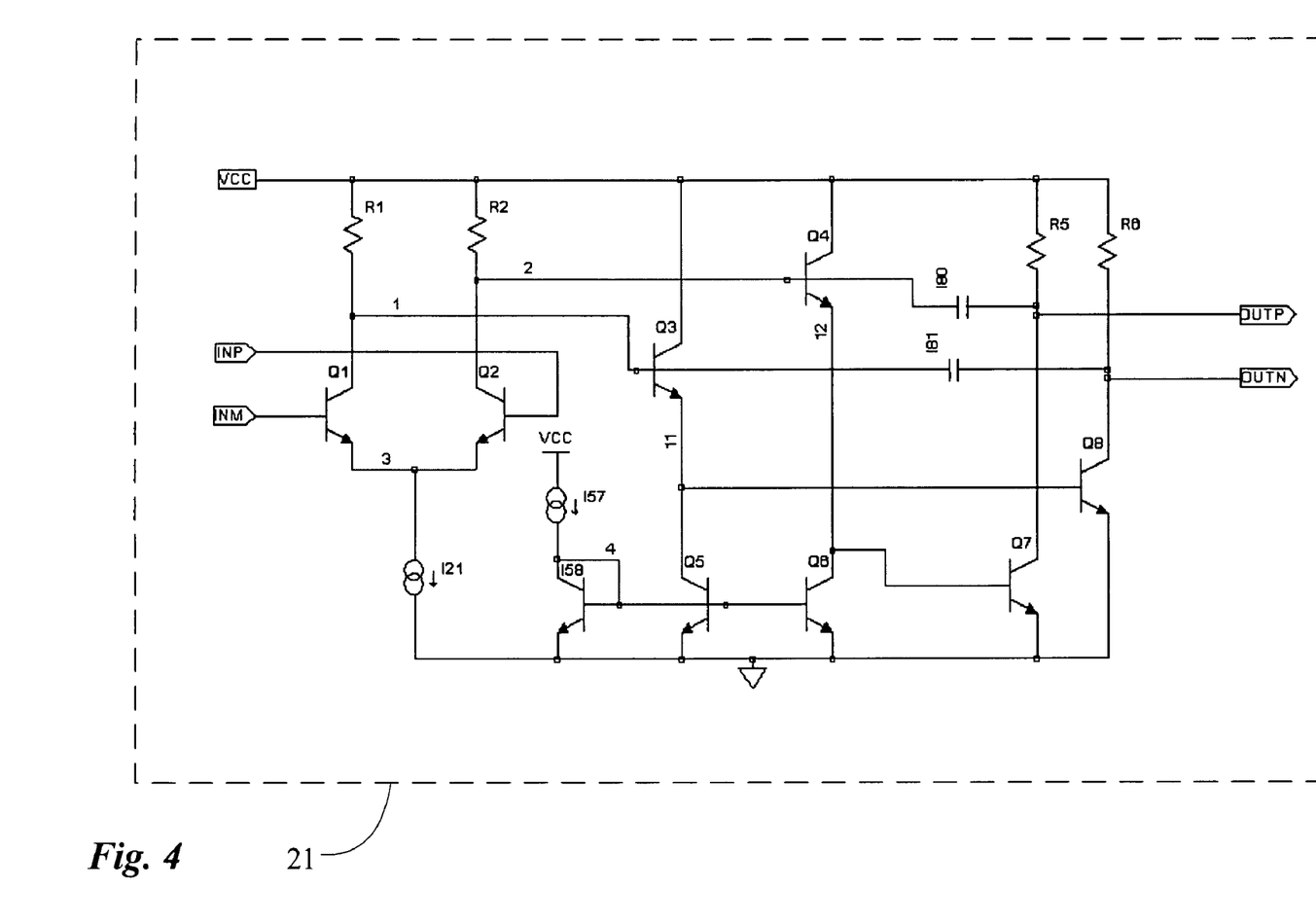
FIG. 4 is a circuit diagram of an exemplary differential amplifier.

FIG. 4 illustrates the circuitry of a differential-output operational amplifier (opamp) with a 50Ω output impedance. In FIG. 4, the terminals INP and INM receive input voltages for application to the operational amplifier 21, from the gain resistors $R_{ip}$ and $R_{in}$ (see earlier Figs.). Transistors Q1 and Q2 form a differential input pair. The base of transistor Q2 is connected to input terminal INP, and the base of transistor Q1 is connected to input terminal INM. The emitters of transistors Q1 and Q2 are connected together and through a constant current source I21 to ground. The collector of transistor Q1 is connected through a load resistor R1 to the supply voltage rail VCC; and the collector of the transistor Q2 is connected through a load resistor R2 to the supply voltage rail VCC. The values of the resistors R1 and R2 determine the gain of the differential pair of the input stage at nodes 1 and 2 of the circuit 21.

Transistors Q3 and Q4 are configured as emitter followers. The signals appearing at nodes 11 and 12 are level shifted versions of the signals from nodes 1 and 2 of the input stage. Transistors Q5 and Q6 serve as emitter current sources for emitter followers Q3 and Q4. Capacitors 180 and 181 are compensation capacitors.

Transistors Q7 and Q8, together with load resistors R5 and R6, form a common emitter output stage for the signals from nodes 11 and 12, that is, from the emitter follower transistors Q3 and Q4. The output stage provides additional amplification for the signals from nodes 11 and 12 and supplies those amplified signals as the outputs on leads OUTP and OUTN.

Left uncorrected, the output-common mode of the amplifier 21 is a function of variations in supply voltage (VCC), base-emitter voltage (Vbe) of the various transistors, variations in resistance (R), variations in current (I) sources and temperature. Variations in base-emitter voltage and resistance are examples of variations in circuit parameters that may result from process variations during manufacture of chips that contain such amplifiers 21.

One-half of the current of source I21 flows through resistor R1 and transistor Q1; and the other half of the current of source I21 flows through resistor R2 and transistor Q2. For a given VCC, the current through the resistors R1 and R2 will establish the voltages at nodes 1 and 2. The voltage drop between node 1 and node 11 is determined by the base-emitter voltage Vbe of emitter-follower transistor Q3 for a given current value supplied by current source transistor Q5. Similarly, the voltage drop between node 2 and node 12 is determined by the base-emitter voltage Vbe of the emitter-follower transistor Q4 for a given current value supplied by current source transistor Q6. These voltages define the common mode for the voltages through the circuit to the nodes 11 and 12. The emitter-follower voltages at 11 and 12 are applied as inputs to the bases of transistors Q7 and Q8. Hence, the voltages from the nodes 11 and 12 define collector currents in transistors Q7 and Q8. The currents through load resistors R5 and R6 establish voltage drops from supply voltage VCC and thereby set the common mode voltages at outputs OUTP and OUTN.

As operational characteristics vary with supplies, processing conditions and temperature, these variations cause variations in the common mode at the outputs OUTP and OUTN. The supply voltage (VCC), the base-emitter voltage (Vbe) of the various transistors, values of resistance (R) for the various resistors, the current (I) produced by the various sources and temperature all are somewhat imprecise and will vary. The uncertainty resulting from the combination of these various effects results in some common mode variation.

Figure 5:
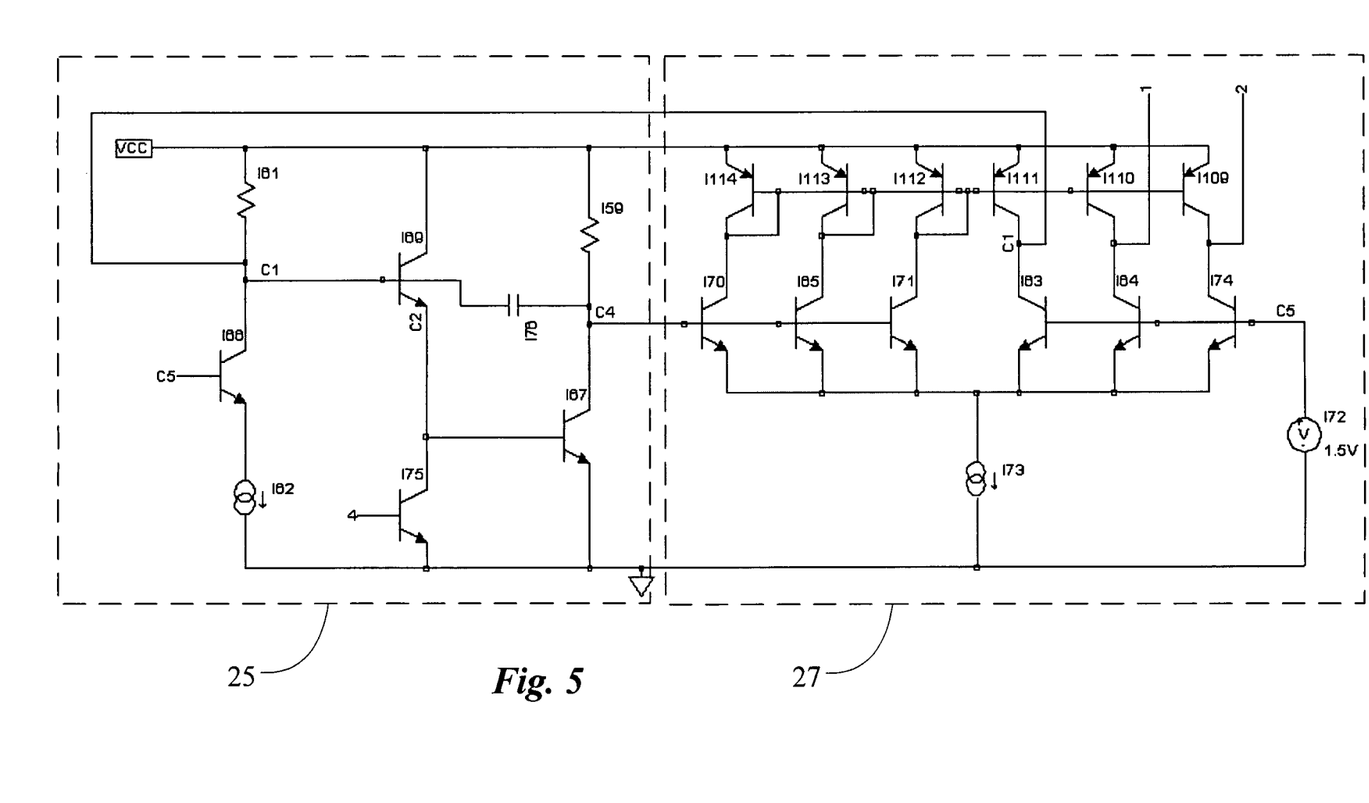
FIG. 5 is a circuit diagram of circuitry to simulate the amplifier of FIG. 4 and provide simulated common mode feedback as a correction signal to the differential amplifier.

The common mode output of the main amplifier 21 (FIG. 4) can be modified by applying bias currents at nodes 1 and 2. The bias control currents for the nodes 1 and 2 of the main amplifier 20, to compensate the common mode performance for the parameter variations, are provided by the combination of a dummy circuit 25 and a comparator circuit 27 (FIG. 5).

The dummy circuit 25 is manufactured by the same process steps, typically on the same chip, as the main amplifier. Hence, it is subject to the same processing variations. Circuit 25 is driven by the same supply voltage and subject to the same operating temperature of the chip. The dummy circuit 25 has an operational characteristic that closely approximates that of the differential amplifier 21. The design of the dummy circuit 25 essentially simulates the common mode operation of the amplifier 21. Those skilled in the art will recognize that a variety of circuits may be used to approximate the common mode operation of any particular differential amplifier.

The dummy circuit 25 replicates the common mode behavior of the differential amplifier 21. As noted, the common mode is essentially the average of two values. For simulation purposes, it is possible to process a single signal (as if the two voltages were equal) and collapse each pair of transistors into a single transistor. Therefore, the dummy circuit 25 may take the form of a 'half-circuit.'

The main amplifier 21 uses a differential input pair of transistors Q1 and Q2, with a current source I21 and associated load resistors R1 and R2. The amplification provided by that pair Q1 and Q2 is replicated in half-circuit 25 by transistor I66. Load resistor I61 is connected from the collector of transistor I66 to the supply voltage rail VCC. A current source I62 is connected to the emitter of the transistor I66. The transistor is responsive to a reference value input at C5. Although other voltages may be used as the input, if the common mode gain is desired to be unity (1), the input at C5 will be the same as the reference voltage provided by source 172 at node C5 (1.5 volts in the example). The arrangement of I61, I62 and I66 provides a gain at node C1 that corresponds to the common mode gain provided by transistors Q1 and Q2 in the input stage of the main amplifier.

Transistor I69, connected as an emitter follower, simulates the emitter follower transistors Q3 and Q4. The signal appearing at node C2 is a level shifted version of the signal from node C1 of the input stage. Transistor 175 serves as a current source for emitter follower transistor I69, analogous to the current sources provided by the transistors Q5 and Q6 in the main amplifier circuit 21. Capacitor I78 is a compensation capacitor that simulates compensation provided by capacitors I80 and I81 in the main amplifier circuit 21.

Transistor I67 and load resistor 159 form a common emitter output stage for the signal from node C2. The output stage simulates the common emitter output stage provided by transistors Q7 and Q8 and load resistors R5 and R6 in the main amplifier circuit 21. The output stage provides additional amplification for the signal from nodes C2 and supplies the amplified signal at node C4. Since the half-circuit is driven by a common mode reference input at C5, the signal at C4 is a simulation of the common mode output of the main amplifier circuit 21.

Hence, half-circuit 25 of FIG. 5 creates, at node C4, a voltage equal to the uncorrected output common mode of the amplifier 21. Because the circuit 25 is subject to the same variations as is the main differential amplifier 21, the voltage at node C4 represents the common mode as it would appear at the outputs OUTP and OUTN of the main amplifier, including any common mode gain due to those variations.

The comparator 27 generates a current (from collector of NPN transistor I63) that is fed back to node C1 to correct the common mode voltage at C4 so as to set that value (at C4) to the desired value (1.5V in this example). The feedback signal represents the correction necessary to compensate for the various factors that otherwise affect the output of half-circuit 25 and thus output common mode in the main amplifier. A mirrored version of this simulated feedback current (from collectors of NPN transistors I64 and I74) is then fed into nodes 1 and 2 of the main amplifier 21 (FIG. 4), so that the output common mode of the amplifier 21 is corrected in the same manner for the process variations, temperature, variations in supply voltage, etc.

Although other comparator circuits may be used, the example shown at 27 utilizes a differential comparator circuit. Transistors I63 and I71 form a differential pair, and the collectors of the transistors I63 and I71 are connected through current mirror transistors I111 and I112 to supply voltage rail VCC. Transistors I64 and I65 form another differential pair, and the collectors of the transistors I64 and I65 are connected through current mirror transistors I110 and I113 to supply voltage rail VCC. Transistors I74 and I70 form another differential pair, and the collectors of transistors I74 and I70 are connected through current mirror transistors I109 and I114 to supply voltage rail VCC. The emitters of transistors I63, I64, I65, I70, I71 and I74 are connected to a current source I73. Transistors I65, I70 and I71 are responsive to the common mode signal from node C4 of the half-circuit 25. Transistors I63, I64 and I74 are responsive to a common mode reference voltage (1.5 volts in the example) supplied to node C5 from source I72.

The differential pair formed by the transistors I71 and I63 compares the signal at the node C4 to the reference voltage at the node C5 and produces a signal on the collector of transistor I63 representing the difference between the voltage at node C4 and the common mode reference voltage. The collector signal from transistor I63 at node C1 is fed back to the input stage of the half-circuit to provide closed loop feedback control of half-circuit 25. The feedback sets the value of the signal at node C4, that is the representation of the output common mode of the main amplifier 21.

The reference voltage from supply I72 at the node C5 is the output common mode desired for the differential amplifier 21. If the voltage at node C4 equals the voltage at node C5, then no current will flow back to node. C1. However, if there is any variation, then the voltage at node C4 will not be equal to the voltage at node C5, and transistor I63 produces a negative feedback signal proportional to the difference between the voltages. The current fed back from the collector of transistor I63 to node C1 will tend to correct the voltage at C4 until the voltage at node C4 matches the voltage at node C5.

The other differential pairs of the comparator mirror differential pair I63-I71 that provide the feedback to node C1. Hence, the voltages on the collectors of transistors I64 and I74 mirror the feedback voltage provided from the collector of transistor I63 to node C1. These control voltages from the collectors of transistors I64 and I74 are supplied to the nodes 1 and 2 of the main amplifier circuit 21, to control the output common mode of the amplifier in the same manner that the signal fed back to node C1 of the half-circuit 25 controls operation of the half-circuit. The currents supplied to nodes 1 and 2 of the main amplifier steer the voltages at OUTP and OUTN in the same manner that the feedback to the node C1 steers the voltage at node C4 in half-circuit 25, so that the output common mode will equal the reference voltage applied at node C5.

Figure 6:
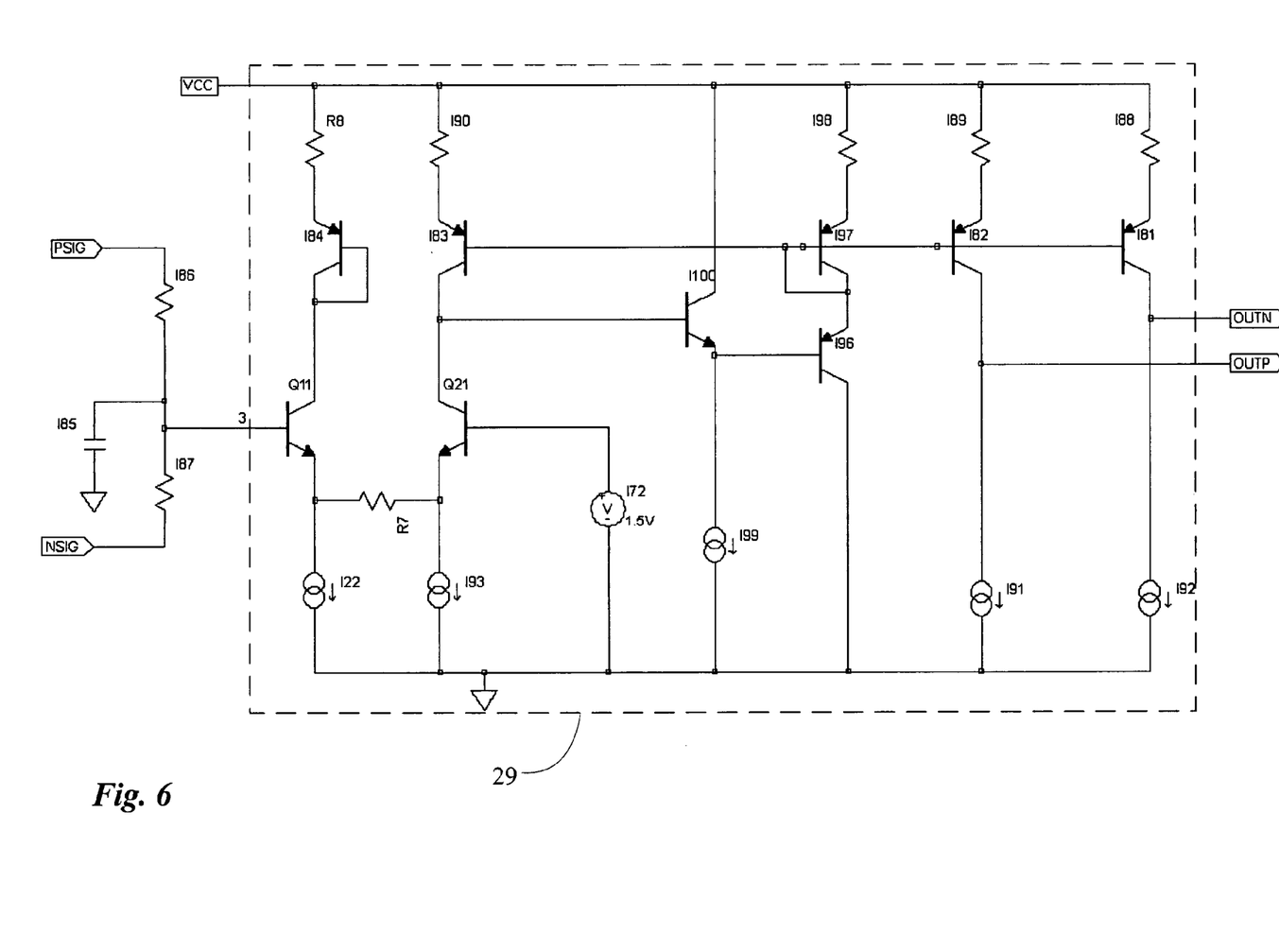
FIG. 6 is a circuit diagram of circuitry to measure the input common mode voltage and apply a current to the outputs of the differential amplifier of FIG. 4, to compensate for any common mode current that would otherwise flow through the feedback resistors into the output impedance of the amplifier when there is a difference between input and output common modes.

FIG. 6 is a schematic diagram of an example of an implementation of the common mode measurement and of the transconductance amplifier of FIG. 2. The circuit in FIG. 6 measures the input common mode (average of PSIG and NSIG), and converts the difference between this value and the default value (here 1.5V) to a current, which it supplies to the output nodes OUTP and OUTN. This current is of a magnitude that cancels out current through the gain- and feedback-resistors due to the variation in input common mode.

In the circuit of FIG. 6, a pair of equal value resistors I86 and I87 are connected across the differential input lines PSIG and NSIG. A capacitor I85 links the node 3, that is, the connection between the resistors I86 and I87, and ground. The voltage appearing at node 3 represents the average value of the two input signals applied at inputs PSIG and NSIG, and represents a measure of the input common mode.

Input transistors Q11 and Q21, together with resistor R7, form a degenerated differential pair. The input common mode value from node 3 is input to the base of transistor Q11. Reference source I72 (1.5 volts in the example) applies the reference voltage for the default input common mode, to the input of the other transistor Q21 of the pair. In the example, this is the same source I72 as is used for the reference in the comparator circuit 27 of FIG. 5, assuming a unity gain with respect to common mode and a desired output common mode of 1.5 volts. If the input common mode is the same as the output common mode, then there is no flow of current forward from the inputs though the gain and feedback resistors, and there is no need for the transconductance amplifier 29 to compensate for such a current flow. To the extent that the value for the input common mode at node 3 is different from the output common mode reference value, then there is a need for current correction in the output of the main amplifier.

The degenerated pair formed by transistors Q11 and Q21 and resistor R7 form a transconductance stage responsive to the difference between the input common mode at node 3 from the output common mode reference value from source I72. The difference in the collector currents of Q11 and Q21 are proportional to that difference. The remainder of the circuit is a current mirror responsive to current at the collector of transistor Q21, for generating the corrective currents for injection at OUTP and OUTN of main amplifier 21.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A differential amplification circuit comprising:
   a differential amplifier; and
   common mode control circuitry, coupled to the differential amplifier, and configured without feedback to control output common mode of the differential amplifier, wherein the common mode control circuitry comprises:
   a dummy circuit for simulating common mode operation of the differential amplifier; and
   a circuit for comparing a signal representing the simulated output common mode of the differential amplifier to a common mode reference value, to produce a correction signal;
   wherein the output common mode of the differential amplifier is controlled in response to the correction signal.

2. A differential amplification circuit comprising:
   a differential amplifier; and
   common mode control circuitry, coupled to the differential amplifier, and configured without feedback to control output common mode of the differential amplifier, wherein the common mode control circuitry comprises:
   an averaging circuit coupled to measure an average of signals input to the differential amplification circuit; and
   an amplifier coupled to the averaging circuit, and configured to produce a current proportional to a difference between the measured average of the input signals and a common mode reference value, and coupled to supply the current as a correction to an output of the differential amplifier.

3. The circuit of claim 2, wherein the common mode control circuitry further comprises:
   a dummy circuit for simulating common mode operation of the differential amplifier; and
   a circuit for comparing a signal produced by the dummy circuit to a common mode reference value, to produce a correction signal;
   wherein the output common mode of the differential amplifier is controlled in response to the correction signal.

4. A circuit for providing differential amplification, comprising:
   a differential amplifier for amplifying a difference between input signals and supplying an amplified output signal difference;
   a dummy circuit having an operational characteristic corresponding to an operational characteristic of the differential amplifier;
   a circuit for comparing a signal produced by the dummy circuit to a common mode reference value, to produce a correction signal corresponding to a feedback signal for adjusting operation of the dummy circuit to correspond to the common mode reference value; and
   a circuit for coupling the correction signal to the differential amplifier, to adjust output common mode of the differential amplifier.

5. The circuit of claim 4, wherein the dummy circuit comprises a half-circuit equivalent of the differential amplifier, receiving the same supply voltage and being at the same temperature as the differential amplifier.

6. The circuit of claim 5, wherein:
   the differential amplifier comprises a differential transistor pair; and
   the half-circuit comprises a transistor circuit equivalent of the differential transistor pair.

7. The circuit of claim 5, wherein the half circuit is responsive to the common mode reference value.

8. The circuit of claim 5, wherein the circuit for comparing comprises:
   a first differential transistor pair responsive to a signal output of the half-circuit simulating the common mode of the outputs of the differential amplifier and responsive to the common mode reference value, wherein an output of the first differential transistor pair provides feedback for adjusting operation of the dummy circuit to correspond to the common mode reference value; and
   at least one second differential transistor pair responsive to the output of the half-circuit and to the common mode reference value mirroring the first differential transistor pair to produce a signal substantially equal to the output of the first differential transistor pair for application to the differential amplifier as the correction signal.

9. A circuit for providing differential amplification, comprising:
   a differential amplifier, for amplifying a difference between input signals and supplying an amplified output signal difference;
   feedback from outputs to inputs of the differential amplifier;
   an averaging circuit for measuring an average value of the input signals; and
   a common mode control circuit responsive to the average of the input signals, for supplying a current to an output of the differential amplifier to offset any current that would flow forward from an input of the differential amplifier through at least one resistor.

10. The circuit of claim 9, wherein the common mode control circuit comprises a differential transconductance amplifier for producing the current in response to a difference between the measured average value and a common mode reference value.

11. The circuit of claim 10, wherein the differential transconductance amplifier comprises transistors and a resistor forming a degenerated differential pair responsive to the measured average and to the common mode reference value.

12. The circuit of claim 11, wherein the differential transconductance amplifier further comprises a current mirror responsive to an output of the degenerated differential pair for supplying the current to the output of the differential amplifier.

13. A circuit for providing differential amplification, comprising:
   a differential amplifier, for amplifying a difference between input signals and supplying an amplified output signal difference;
   feedback from outputs to inputs of the differential amplifier;
   a dummy circuit having an operational characteristic corresponding to an operational characteristic of the differential amplifier;
   a circuit for comparing a signal produced by the dummy circuit to a common mode reference value, to produce a correction signal corresponding to a feedback signal for adjusting operation of the dummy circuit to correspond to the common mode reference value; and
   a circuit for coupling the correction signal to the differential amplifier, to adjust output common mode of the differential amplifier;
   an averaging circuit for measuring an average value of the input signals; and
   a transconductance circuit responsive to the measured average value of the input signals for supplying a current to an output of the differential amplifier to offset any current that would otherwise flow forward from an input of the differential amplifier through the feedback.

14. The circuit of claim 13, wherein the dummy circuit comprises a half-circuit equivalent of the differential amplifier, receiving the same supply voltage and being at the same temperature as the differential amplifier.

15. The circuit of claim 14, wherein:
   the differential amplifier comprises a differential transistor pair; and
   the half-circuit comprises a transistor circuit equivalent of the differential transistor pair.

16. The circuit of claim 14, wherein the half circuit is responsive to the common mode reference value.

17. The circuit of claim 14, wherein the circuit for comparing comprises:
   a first differential transistor pair responsive to a signal output of the half-circuit simulating the common mode of the outputs of the differential amplifier and being responsive to the common mode reference value, wherein an output of the first differential transistor pair provides feedback for adjusting operation of the dummy circuit to correspond to the common mode reference value; and
   at least one second differential transistor pair responsive to the signal output of the half-circuit and to the common mode reference value mirroring the first differential transistor pair to produce a signal substantially equal to the output of the first differential transistor pair for application to the differential amplifier as the correction signal.

18. The circuit of claim 13, wherein the transconductance circuit comprises a differential transconductance amplifier for producing current in response to a difference between the measured average and a common mode reference value.

19. The circuit of claim 18, wherein the differential transconductance amplifier comprises transistors and a resistor forming a degenerated differential pair responsive to the measured average and to the common mode reference value.

20. The circuit of claim 19, wherein the differential transconductance amplifier further comprises a current mirror responsive to an output of the degenerated differential pair for supplying the current to the output of the differential amplifier.

* * * * *